United States Patent

(12) United States Patent
Orcutt

(10) Patent No.: US 9,356,419 B1
(45) Date of Patent: May 31, 2016

(54) TEMPERATURE INSENSITIVE EXTERNAL CAVITY LASERS ON SILICON

(71) Applicant: International Business Machines Corporation, Armonk, NY (US)

(72) Inventor: Jason S. Orcutt, Katonah, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/682,167

(22) Filed: Apr. 9, 2015

(51) Int. Cl.
*H01S 3/10* (2006.01)
*H01S 5/343* (2006.01)
*H01S 5/30* (2006.01)
*H01S 5/028* (2006.01)

(52) U.S. Cl.
CPC ........... *H01S 3/10053* (2013.01); *H01S 5/0287* (2013.01); *H01S 5/3013* (2013.01); *H01S 5/343* (2013.01)

(58) Field of Classification Search
CPC .... H01S 3/10053; H01S 5/0287; H01S 5/343
See application file for complete search history.

(56) References Cited

U.S. PATENT DOCUMENTS

| 6,101,210 | A | 8/2000 | Bestwick et al. |
| 6,987,784 | B2 | 1/2006 | Woodley et al. |
| 7,565,084 | B1 | 7/2009 | Wach |
| 8,306,375 | B2 | 11/2012 | Kato |
| 8,368,995 | B2 | 2/2013 | Dallesasse et al. |
| 2009/0274420 | A1* | 11/2009 | Vallee ................ G02B 6/02133 385/37 |
| 2012/0308175 | A1* | 12/2012 | Doerr ........................ G02F 1/21 385/14 |
| 2013/0083815 | A1 |  4/2013 | Fang et al. |

OTHER PUBLICATIONS

A. Zilkie et al., "Power-efficient III-V/Silicon external cavity DBR lasers," Optics Express, vol. 20, No. 21, 2012, pp. 23456-23462.
B. Koch et al., "Integrated silicon photonic laser sources for telecom and datacom," National Fiber Optic Engineers Conference, Optical Society of America, 2013, PDP5C-8, 3 pages.
J. Lee et al., "High power and widely tunable Si hybrid external-cavity laser for power efficient Si photonics WDM links," Optics Express, vol. 22, No. 7, 2014, pp. 7678-7685.
J. Orcutt, "External Cavity Laser Based Wavelength Divison Multiplexing Superchannel Transceivers," Related Application, U.S. Appl. No. 14/682,158, filed Apr. 9, 2015.
J. Orcutt, "Tuning External Cavity Lasers Within CWDM Transmitters for Temperature Insensitivity and Superchannel Construction," Related Application, U.S. Appl. No. 14/682,164, filed Apr. 9, 2015.

(Continued)

*Primary Examiner* — Dung Nguyen
(74) *Attorney, Agent, or Firm* — Canton Colburn LLP; Vazken Alexanian

(57) ABSTRACT

A technique related to a semiconductor chip is provided. An optical gain chip is attached to a semiconductor substrate. An integrated photonic circuit is on the semiconductor substrate, and the optical gain chip is optically coupled to the integrated photonic circuit thereby forming a laser cavity. The integrated photonic circuit includes an active intra-cavity thermo-optic optical phase tuner element, an intra-cavity optical band-pass filter, and an output coupler band-reflect optical grating filter with passive phase compensation. The active intra-cavity thermo-optic optical phase tuner element, the intra-cavity optical band-pass filter, and the output coupler band-reflect optical grating filter with passive phase compensation are optically coupled together.

13 Claims, 11 Drawing Sheets

(56) References Cited

OTHER PUBLICATIONS

List of IBM Patents or Patent Applications Treated as Related; Apr. 9, 2015; pp. 1-2.

S. Tanaka et al., "Four-Wavelength Silicon Hybrid Laser Array with Ring-Resonator Based Mirror for Efficient CWDM Transmitter," Optical Fiber Communication Conference, Optical Society of America, 2013, OTh1D-3, 3 pages.

* cited by examiner

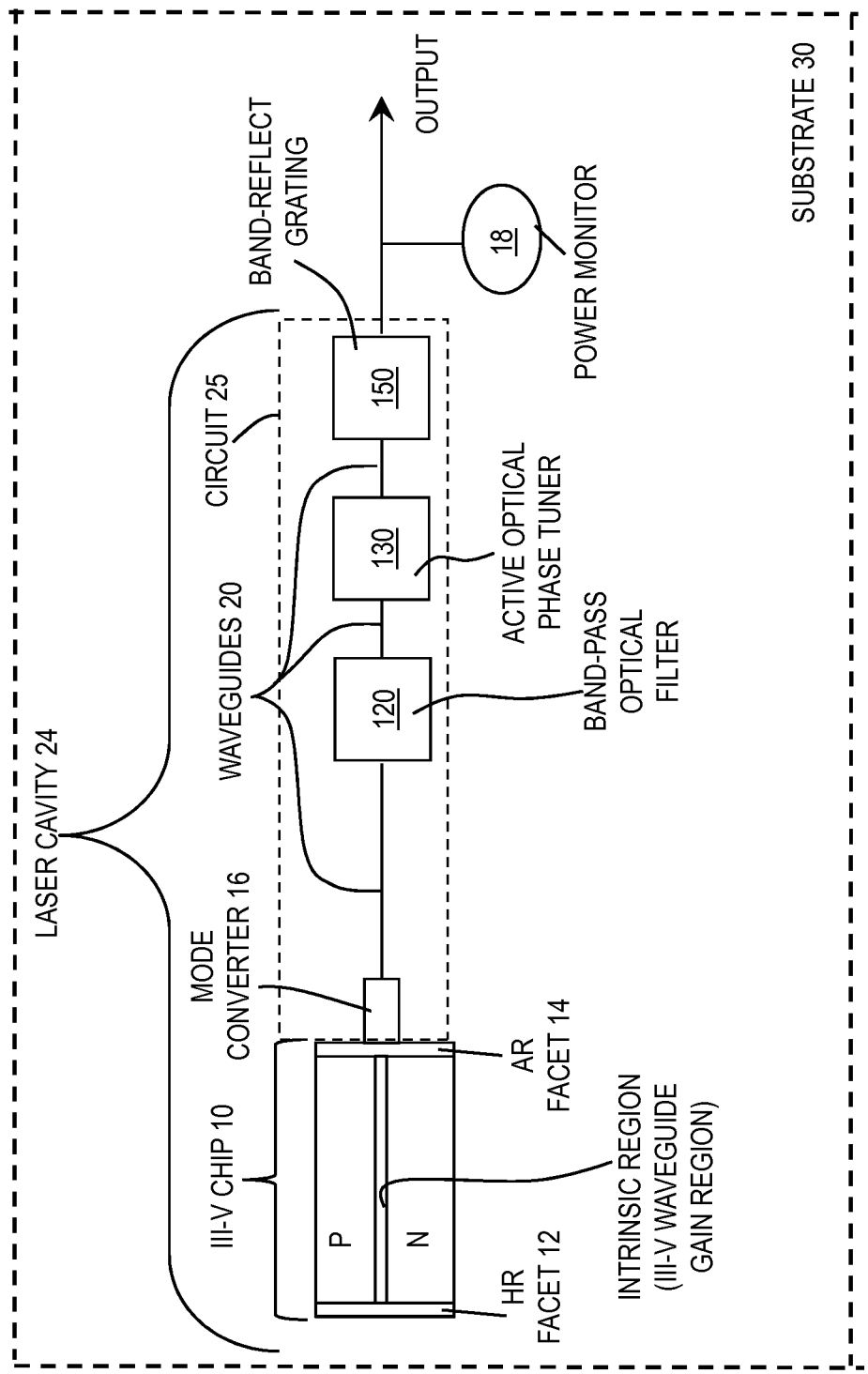

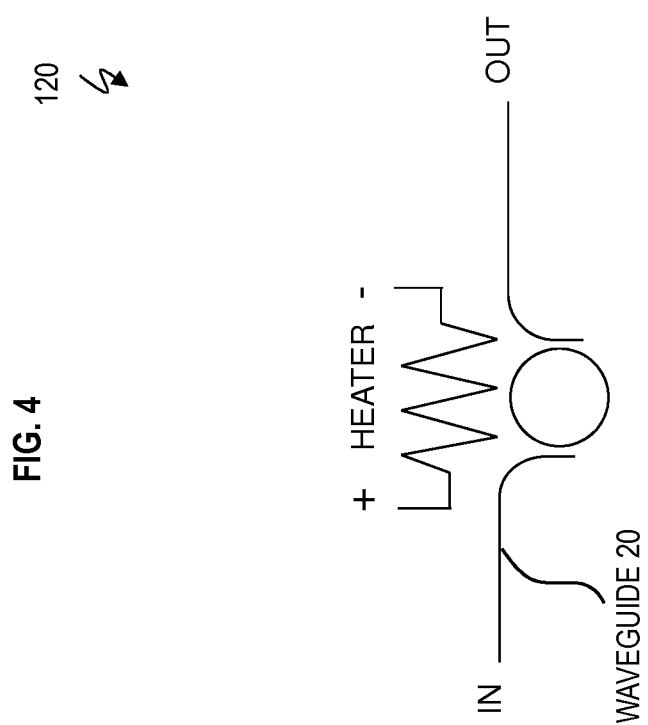

FIG. 11

PROVIDE AN OPTICAL GAIN CHIP ATTACHED TO A SEMICONDUCTOR SUBSTRATE 1105

PROVIDE AN INTEGRATED PHOTONIC CIRCUIT ON THE SEMICONDUCTOR SUBSTRATE, WHERE THE OPTICAL GAIN CHIP IS OPTICALLY COUPLED TO THE INTEGRATED PHOTONIC CIRCUIT THEREBY FORMING A LASER CAVITY 1110

THE INTEGRATED PHOTONIC CIRCUIT COMPRISING AN OUTPUT COUPLER BAND-REFLECT OPTICAL GRATING FILTER WITH PASSIVE PHASE COMPENSATION, AN ACTIVE INTRA-CAVITY THERMO-OPTIC OPTICAL PHASE TUNER ELEMENT, AND AN INTRA-CAVITY OPTICAL BAND-PASS FILTER 1115

OPTICALLY COUPLING TOGETHER THE OUTPUT COUPLER BAND-REFLECT OPTICAL GRATING FILTER WITH PASSIVE PHASE COMPENSATION, THE ACTIVE INTRA-CAVITY THERMO-OPTIC OPTICAL PHASE TUNER ELEMENT, AND THE INTRA-CAVITY OPTICAL BAND-PASS FILTER 1120

TEMPERATURE INSENSITIVE EXTERNAL CAVITY LASERS ON SILICON

BACKGROUND

The present invention relates to an external cavity laser on silicon, and more specifically, to temperature insensitive external cavity lasers on silicon.

An optical cavity or optical resonator is an arrangement of mirrors that forms a standing wave cavity resonator for light waves. Optical cavities are a major component of lasers, surrounding the gain medium and providing feedback of the laser light. They are also used in optical parametric oscillators and some interferometers. Light confined in the cavity reflects multiple times, producing standing waves for certain resonance frequencies. The standing wave patterns produced are called modes. Longitudinal modes differ only in frequency while transverse modes differ for different frequencies and have different intensity patterns across the cross section of the beam.

Different resonator types are distinguished by the focal lengths of the two mirrors and the distance between them. Flat mirrors are not often used because of the difficulty of aligning them to the needed precision. The geometry (resonator type) must be chosen so that the beam remains stable, which means that the size of the beam does not continually grow with multiple reflections. Resonator types are also designed to meet other criteria such as minimum beam waist or having no focal point inside the cavity. Optical cavities are designed to have a large Q factor, which means that the light beam will reflect a very large number of times with little attenuation. Therefore, the frequency line width of the beam is very small compared to the frequency of the laser.

Light confined in a resonator will reflect multiple times from the mirrors, and due to the effects of interference, only certain patterns and frequencies of radiation will be sustained by the resonator, with the others being suppressed by destructive interference. In general, radiation patterns which are reproduced on every round-trip of the light through the resonator are the most stable, and these are the eigenmodes, known as the modes, of the resonator.

Resonator modes can be divided into two types: longitudinal modes, which differ in frequency from each other; and transverse modes, which may differ in both frequency and the intensity pattern of the light. The basic or fundamental transverse mode of a resonator is a Gaussian beam.

The most common types of optical cavities consist of two facing plane (flat) or spherical mirrors. The simplest of these is the plane-parallel or Fabry-Pérot cavity, consisting of two opposing flat mirrors. Plane-parallel resonators are therefore commonly used in microchip lasers, microcavity lasers, and semiconductor lasers. In these cases, rather than using separate mirrors, a reflective optical coating may be directly applied to the laser medium itself.

SUMMARY

According to one embodiment, a semiconductor chip is provided. The chip includes an optical gain chip attached to a semiconductor substrate and an integrated photonic circuit on the semiconductor substrate. The optical gain chip is optically coupled to the integrated photonic circuit thereby forming a laser cavity. The integrated photonic circuit includes an active intra-cavity thermo-optic optical phase tuner element, an intra-cavity optical band-pass filter, and an output coupler band-reflect optical grating filter with passive phase compensation. The active intra-cavity thermo-optic optical phase tuner element, the intra-cavity optical band-pass filter, and the output coupler band-reflect optical grating filter with passive phase compensation are optically coupled together.

According to one embodiment, a method of configuring a semiconductor chip is provided. The method includes providing an optical gain chip attached to a semiconductor substrate, and providing an integrated photonic circuit on the semiconductor substrate. The optical gain chip is optically coupled to the integrated photonic circuit thereby forming a laser cavity. The integrated photonic circuit includes an active intra-cavity thermo-optic optical phase tuner element, an intra-cavity optical band-pass filter, and an output coupler band-reflect optical grating filter with passive phase compensation. The active intra-cavity thermo-optic optical phase tuner element, the intra-cavity optical band-pass filter, and output coupler band-reflect optical grating filter with passive phase compensation are optically coupled together.

According to one embodiment, a semiconductor chip is provided. The semiconductor chip includes an optical gain chip attached to a semiconductor substrate, an N-port demultiplexing filter, and a plurality of integrated photonic circuits on the semiconductor substrate. The optical gain chip is optically coupled to the plurality of integrated photonic circuits thereby forming a laser cavity. The plurality of integrated photonic circuits each comprise an output coupler band-reflect optical grating filter with passive phase compensation, an active intra-cavity thermo-optic optical phase tuner element, and an intra-cavity optical band-pass filter. The output coupler band-reflect optical grating filter with passive phase compensation, the active intra-cavity thermo-optic optical phase tuner element, the intra-cavity optical band-pass filter are optically coupled together. The N-port demultiplexing filter is configured to provide different wavelengths of light to individual ones of the plurality of integrated photonic circuits.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 illustrates a single frequency cavity diagram of a laser on a silicon chip according to an embodiment;

FIG. 4 illustrates an example intra-cavity transmission-mode optical band-pass filter according to an embodiment;

FIG. 11 illustrates a method of configuring the semiconductor chip according to an embodiment.

DETAILED DESCRIPTION

Figure 1:
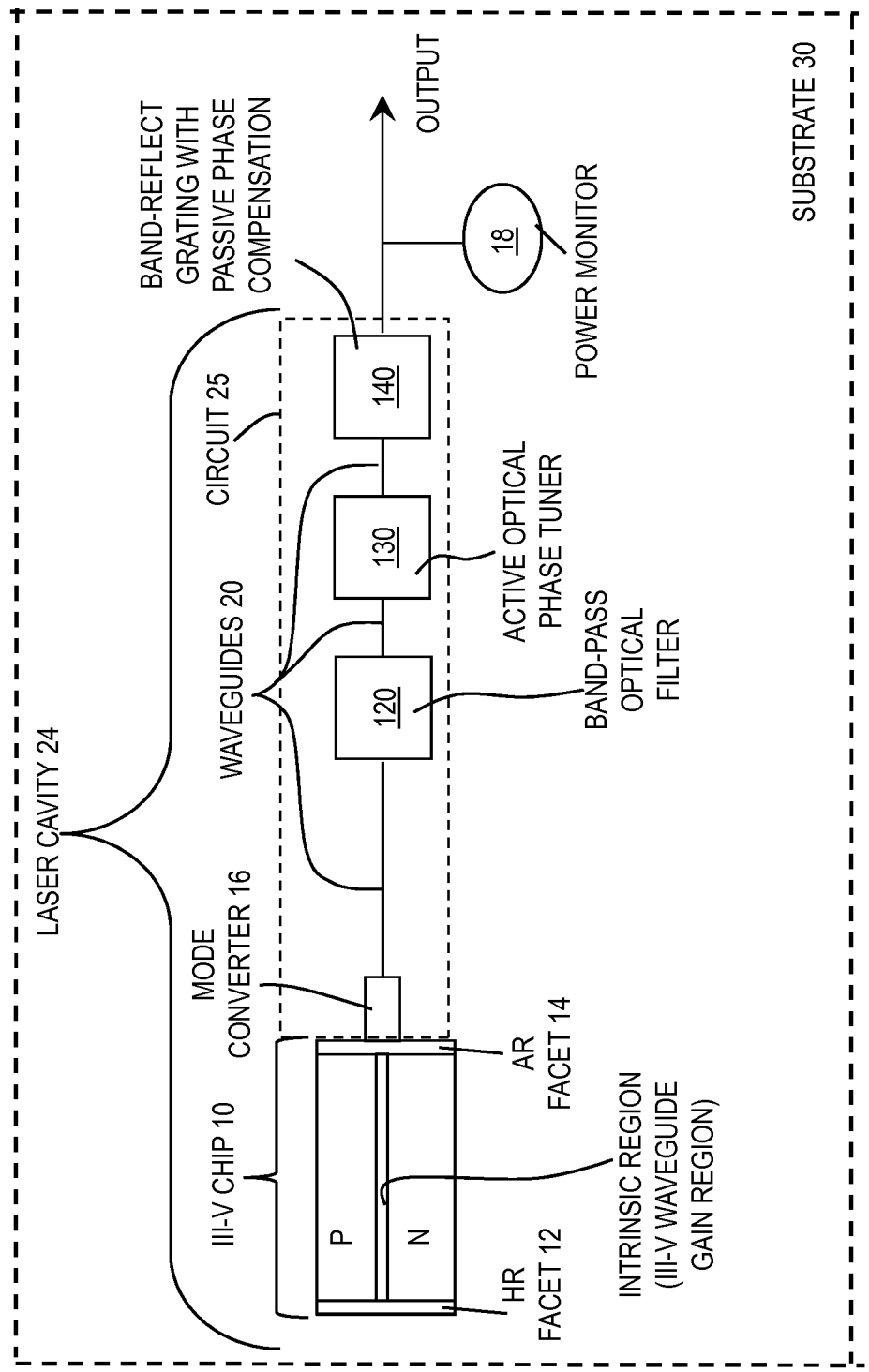
FIG. 1 illustrates a single frequency cavity diagram of a laser on a silicon chip according to an embodiment.

Although laser light is perhaps the purest form of light, it is not of a single, pure frequency or wavelength. All lasers produce light over some natural bandwidth or range of frequencies. A laser's bandwidth of operation is determined primarily by the gain medium from which the laser is constructed and by the range of frequencies over which a laser may operate (known as the gain bandwidth).

The second factor to determine a laser's emission frequencies is the optical cavity (or resonant cavity) of the laser. In the simplest case, this consists of two plane (flat) mirrors facing each other, surrounding the gain medium of the laser (again this arrangement is known as a Fabry-Pérot cavity). Since light is a wave, when bouncing between the mirrors of the cavity, the light will constructively and destructively interfere with itself, leading to the formation of standing waves or modes between the mirrors. These standing waves form a discrete set of frequencies, known as the longitudinal modes of the cavity. These modes are the only frequencies of light which are self-regenerating and allowed to oscillate by the resonant cavity, while all other frequencies of light are suppressed by destructive interference. For a simple plane-mirror cavity, the allowed modes are those for which the separation distance of the mirrors L is an exact multiple of half the wavelength of the light $\lambda$, such that $L=q\lambda/2$, where q is an integer known as the mode order.

In a simple laser, each of these modes oscillates independently, with no fixed relationship between each other, in essence like a set of independent lasers all emitting light at slightly different frequencies. The individual phase of the light waves in each mode is not fixed and may vary randomly due to such things as thermal changes (i.e., temperature) in materials of the laser. In lasers with only a few oscillating modes, interference between the modes can cause beating effects in the laser output, leading to fluctuations in intensity. In lasers with many thousands of modes, these interference effects tend to average to a near-constant output intensity.

Embodiments are configured to provide temperature insensitive (i.e., thermal insensitive) optical laser cavities. According to embodiments, the temperature insensitive external cavity lasers on silicon provide various benefits:

(1) Cost reduction is achievable by simplifying laser fabrication and eliminating operating wavelength tolerance as yield limitation. Lasing frequency is set by silicon fabricated components that have a high fabrication precision and inherent tunability with no extra cost.

(2) Stabilization of lasing frequency is achievable by active or passive means in the silicon fabricated section at any desired temperature throughout operation range.

(3) Relative intensity noise (RIN) may be reduced (performance improvement) by the cavity length increase and high-extinction intra-cavity optical filter.

(4) Narrowband filter used in the passive cavity may enable silicon on-chip isolator through time gating modulators at transceiver bitrate.

(5) The III-V chip is identical to plan-of-record distributed feedback (DFB) lasers except that the grating fabrication step is omitted by the laser vendor.

Now turning to the figures, FIG. 1 illustrates a single frequency cavity diagram of a laser on a silicon chip 100 according to an embodiment. The silicon chip 100 is a laser or laser system. Although silicon may discussed as an example chip and substrate material, it is understood that other semiconductor materials may be utilized including a germanium wafer.

The silicon chip 100 has a III-V chip 10 mounted on the substrate 30 (e.g., silicon wafer) of the silicon chip 100. The III-V chip 10 may also be referred to as a III-V die, a III-V semiconductor chip, and/an optical gain chip/medium as understood by one skilled in the art. The combination of the III-V chip 10 mounted on the silicon substrate 30 of the silicon chip 100 may be referred to as a hybrid silicon laser. The hybrid silicon laser is a semiconductor laser fabricated from both silicon and group III-V semiconductor materials. Group III and group V are designations on the periodic table. The hybrid approach takes advantage of the light-emitting properties of III-V semiconductor materials combined with the process maturity of silicon to fabricate electrically driven lasers on a silicon wafer that can be integrated with other silicon photonic devices.

The III-V chip 10 may be a laser diode that is an electrically pumped semiconductor laser in which the active (gain) medium is formed by a p-n junction (p-type doped region and n-type doped region) of a semiconductor diode similar to that found in a light-emitting diode. A laser diode is electrically a PIN diode (also referred to as a p-i-n diode), which is a diode with a wide, undoped intrinsic (I) semiconductor region between a p-type (P) semiconductor and an n-type (N) semiconductor region. The p-type and n-type regions are typically heavily doped because they are used for ohmic contacts. The active (gain) region of the laser diode is in the intrinsic (I) region, and the carriers (i.e., electrons and holes) are pumped into intrinsic (I) region from the N and P regions respectively. While initial diode laser research was conducted on simple P-N diodes, modern lasers use the double-heterostructure implementation, where the carriers and the photons are confined in order to maximize their chances for recombination and light generation. Unlike a regular diode used in electronics, the goal for a laser diode is that all carriers recombine in the I region and thus produce light. Accordingly, laser diodes are fabricated using direct bandgap semiconductors. The laser diode epitaxial structure is grown using one of the crystal growth techniques, usually starting from an N doped substrate, and growing the I doped active layer, followed by the P doped cladding, and a contact layer. The active layer most often consists of quantum wells, which provide lower threshold current and higher efficiency. A method of powering some laser diode is the use of optical pumping. Optically pumped semiconductor lasers (OPSL) use the III-V semiconductor chip 10 as the gain medium, and use another laser (often another diode laser) as the pump source. One skilled in the art understands the use and operation of a laser using a III-V semiconductor chip.

Referring back to FIG. 1, the III-V chip 10 has a high rear reflective (HR) coating facet 12 on one end and has antireflective (AR) coating facet 14 on the other end. The light increases in intensity in the gain region (intrinsic region (I)) of the III-V chip 10.

The III-V chip 10 is attached/mounted to silicon chip 100 and aligned for optical coupling by any flip-chip or wirebond mounting option known to one skilled in the art. The III-V chip 10 (e.g., a hybrid silicon laser) is an optical source that is fabricated from both silicon and group III-V semiconductor materials, where the group III-V semiconductor materials may include, e.g., Indium (III) phosphide (V), gallium (III) arsenide (V), nitrogen (V), etc. A mode converter 16 is coupled to the III-V chip 10. In one case, the mode converter 16 may be identical to that required to couple a distributed feedback laser (DFB) with similar requirements for low insertion loss and reflection as understood by one skilled in the art. A mode converter 16 (also referred to as mode size converter) includes optical devices which allow for efficient coupling between modes of different sizes. A mode (size) converter (or mode size adapter) is an optical device which can be used for expanding or contracting a mode in the transverse spatial dimensions. For example, a mode converter could expand the very tiny mode of the waveguide in a laser diode to a size which fits to the mode of an optical fiber.

The mode converter 16 couples the III-V chip 10 to the waveguide 20. Although shown schematically as entirely external to the III-V chip 10, it is understood that mode converting components 16 may also include components, e.g. active or passive waveguide sections with different dimensions that the primary gain waveguide section, fabricated on the III-V chip 10. The waveguide 20 connects to various intra-cavity optical elements 120, 130, and 140 on the silicon chip 100 as understood by one skilled in the art. The order of the intra-cavity optical elements 120 and 130 shown is arbitrary and is not meant to be limiting. It is contemplated that either order of the intra-cavity optical elements 120 and 130 is possible. The intra-cavity optical elements 120, 130, 140 may be an external integrated photonic circuit 25 fabricated on the silicon substrate 30 of the silicon chip 100.

A laser cavity 24 is formed between the III-V gain chip 10 and the external integrated photonic circuit 25, specifically between the HR facet 12 and the band-reflect grating 140. To provide a basis for the following discussion, the magnitude of the dominant polarization of the electric field, E or modal amplitude, in the laser resonator will be described as a function of time, t, and longitudinal position, z. The coordinate system is defined such that the HR facet (element 12) of the III-V chip (element 10) is z=0. The expression for the modal amplitude can then be described by the function $E(\omega, z, t, T) = A_{forward}(z) \cdot e^{i(\omega t - k(\omega, z, T)z)} + A_{reverse}(z) \cdot e^{i(k(\omega, z, T)z - \omega t)}$. The real valued $A_{forward}(z)$ and $A_{reverse}(Z)$ functions define the amplitude of the forward and backward propagating fields in the laser cavity subject to the loss and gain from the intra-cavity elements. Remaining variables are defined as follows: $\omega$ is the angular frequency of the optical mode of interest; T is the local temperature (i.e. rigorously T(z)); k($\omega$, z, T) is the wavevector of the optical mode of the given angular frequency, for the given longitudinal position and temperature. For clarity, the effects of reflections from intra-cavity elements are neglected and details associated with the phase change resulting from transmission through the intra-cavity filter are neglected. All intra-cavity elements are treated as waveguides with arbitrary k(z, $\omega$, T) characteristics.

The laser cavity as defined then supports a continuum of longitudinal optical modes $\omega_0, \omega_1, \ldots \omega_m$ that are determined by the round-trip constructive interference condition of the resonator. As is well known within the field, this interference condition is satisfied when the accumulated optical phase of the round-trip propagation, $\phi$, equals an integer multiple of $2\pi$. Using the above conventions and defining the position of effective reflection within the band-reflect grating 140 for the given modal angular frequency and local temperature as z"($\omega$, T), the round trip phase is given by:

$$\phi(\omega,T) = 2\int_0^{z''(\omega,T)} k(\omega,z,T)zdz$$

To simplify the analysis, the case of uniform, frequency independent modal effective indices, $n_{III-V}(T)$ and $n_{Si}(T)$, will be considered for the III-V chip 10 and the silicon external cavity 25 respectively. The longitudinal coordinate for the interface between the III-V chip 10 and the silicon external cavity 25 is then defined as z' with the lengths of the two cavity halves as $L_{III-V}$ and $L_{Si}(T)$ respectively. The length of the silicon external cavity 25 is still considered temperature dependent in this analysis due to z"($\omega$,T), but the frequency dependence is ignored. The resulting round trip phase can then be expressed simply by expanding the wavevector in terms of the effective index, angular frequency and vacuum speed of light, c, as a function of position:

$$\phi(\omega,T) = 2\omega/c(n_{III-V}(T)L_{III-V} + n_{Si}(T)L_{Si}(T))$$

Enforcing the phase matching condition, the angular frequency of operating mode $\omega_m$ can then be expressed as:

$$\omega_m(T) = \frac{(m+1)\pi c}{n_{III-V}(T)L_{III-V} + n_{Si}(T)L_{Si}(T)}$$

Now, further details of the intra-cavity optical elements 120, 130, 140 in the external integrated photonic circuit 25 are discussed below in the context of the above influence on $\omega_m(T)$.

The intra-cavity optical element 120 is an intra-cavity transmission-mode optical band-pass filter 120 with a full-width half-maximum (FWHM) equal to or less than the free-spectral range of the cavity Fabry-Perot (F-P) resonances. The purpose of this filter is to provide operating longitudinal mode selection through loss discrimination such that the filter resonant frequency, $\omega_f$, is actively tuned to be centered on the desired $\omega_m$ while providing sufficient round-trip cavity loss discrimination for adjacent longitudinal modes $\omega_{m-1}$ and $\omega_{m+1}$ to prevent undesired modes from reaching lasing threshold and provide a sufficient side mode suppression ratio. The narrow bandwidth of the intra-cavity filter results in a reduction of laser output power proportional to the magnitude of difference, $\Delta\omega = |\omega_f - \omega_m|$. This enables the output power of the laser to be monitored as a feedback parameter for matching the intra-cavity filter resonance frequency with the longitudinal operating mode through the active control of either mode.

The resonance frequency of the intra-cavity transmission-mode optical band-pass filter 120 is then held constant throughout laser operation (except startup initialization or where intentionally modulated) as a function of temperature through either an athermal design or active control. Examples of athermal design for the band-pass filter include modal thermo-optic coefficient compensation by varying waveguide widths and lengths in a silicon/silicon dioxide interferometer or introducing negative thermo-optic material cladding such as $TiO_2$ over a silicon nanowire ring resonator filter. Examples of active control include controlling integrated heater power based on a temperature sensor feedback signal.

In the case of low free-spectral range filters such as ring resonators, the intra-cavity transmission-mode optical band-pass filter 120 must also be designed such that the free-spectral range is greater than half of the FWHM reflection bandwidth of the band-reflect grating 140. This condition ensures that other longitudinal mode orders of the band-pass filter do not provide alternate low round-trip loss longitudinal laser cavity operating modes.

The intra-cavity optical element 130 is an active intra-cavity transmission-mode thermo-optic optical phase tuner element 130. The active intra-cavity transmission-mode thermo-optic optical phase tuner element 130 may include either a broad-band waveguide section or a narrowband filter such as one or more ring resonator filters in an all-pass transmission phase control configuration. The active intra-cavity transmission-mode thermo-optic optical phase tuner element 130 is configured to adjust round-trip cavity phase to a constant value within the compensated temperature range of laser operation, e.g. 0° Celsius (C)-85° C., based on the measured value of suitable feedback parameter such as laser output power. The active intra-cavity transmission-mode thermo-optic optical phase tuner element 130 provides active control of the round trip phase of the laser operating mode, φ, and this means that the active intra-cavity transmission-mode thermo-optic optical phase tuner element 130 requires power to control the phase. In the context of previous discussion of round trip cavity phase, the active phase tuner 130 of given length, $L_{tune}$, powered to an elevated temperature, $\Delta T_{tune}$, over the ambient temperature $T_{amb}$ controls the operating mode frequency to a constant value, $\omega_m'$, that is independent of $T_{amb}$ by adjusting $\Delta T$ through the effective thermo-optic coefficient of the tuner, $$\frac{dn_{tune}}{dT}:$$

$$\omega_m' = \frac{(m+1)\pi c}{n_{III-V}(T_{amb})L_{III-V} + n_{Si}(T_{amb})L_{Si}(T_{amb}) + \Delta T_{tune}\frac{dn_{tune}}{dT}L_{tune}}.$$

The intra-cavity optical element 140 is a band-reflect grating with passive phase compensation that is the laser output coupler while reducing the net round trip phase change as a function of temperature. The relevant design range for the in-band reflectance is between 5% and 80%. As discussed for element 120, full-width half-maximum (FWHM) reflectance bandwidth of the band-reflect grating with passive phase compensation 140 must be less than double the free-spectral range of the band-pass optical filter 120.

The passive phase compensation properties of the band-reflect grating 140 is accomplished by designing the temperature dependence of the effective mirror position, z"(ω,T), to result in a shorter effective silicon cavity length, $L_{Si}(T)$, with increasing temperature to compensate for the positive effective thermos-optic coefficients of the III-V and silicon waveguides, $$\frac{dn_{III-V}}{dT}$$

and $$\frac{dn_{Si}}{dT}$$

respectively. The desired design condition is then:

$$-\frac{dL_{Si}}{dT}n_{Si} \approx \frac{dn_{Si}}{dT}L_{Si} + \frac{dn_{III-V}}{dT}L_{III-V}$$

This design methodology bounds the round trip phase of the desired laser longitudinal operating mode to within a small total phase change range for a specific designed operating temperature range. Continuous single-mode operation requires that the remaining round trip phase change is within the control range of the active intra-cavity transmission-mode thermo-optical phase tuner 130, e.g. 4π, over the compensated temperature range of laser operation, e.g. 0° C.-85° C. Assuming that the cavity round trip phase change is monotonic with temperature, the example case can then be expressed as:

|φ(ω$_m$,85° C.)−φ(ω$_m$,0° C.)|<4π

The design of the passive phase compensation can be understood through the temperature dependence of the grating's effective mirror position and therefore $L_{Si}$ z"(ω$_m$,T). For a uniform grating, the effective mirror position from the input of the grating, $L_{eff}$(ω,T), can be written in terms of the coupling strength, κ(ω,T), and total grating length $L_g$ as:

$$L_{eff}(\omega, T) = \frac{1}{2\kappa(\omega, T)}\tanh[\kappa(\omega, T)L_g]$$

For the simplest form of thermal compensation, the coupling strength temperature dependence can κ(ω,T) maximized such that the effective grating length is reduced to compensate for the positive thermo-optic coefficient of the rest of the laser cavity. This level of compensation may be sufficient for short laser cavities with strongly reflecting gratings.

Stronger compensation of the net cavity thermo-optic coefficient can be achieved with properly designed chirped gratings. In a chirped grating, the effective index, n, and the grating pitch, Λ, can be varied as a function of position. For a given frequency, ω, the grating pitch that results in maximum reflectance, $\Lambda^{max}(\omega,n)$, is approximately:

$$\Lambda^{max}(\omega, n) = \frac{\pi c}{\omega \cdot n}$$

The design of a linear chirped grating for passive phase compensation of the round trip cavity phase is considered in the context of the previous variable definitions. The effective index in the grating will be approximated as constant and equal to the unpeturbed silicon cavity, $n_{Si}(T)$. The grating pitch as a function of position will then be written in terms of a chirp rate, dΛ/dz, and central pitch corresponding to the maximum reflectance condition for the nominal operating mode, ω$_m$, at reference temperature $T_0$:

$$\Lambda(z) = \frac{d\Lambda}{dz}\left(z - \frac{L_g}{2}\right) + \Lambda^{max}(\omega_m, n_{Si}(T_0))$$

To simplify the analysis, we can treat the effective mirror position as being defined as the point where the grating pitch maximizes the reflectance for the operating mode angular frequency ω$_m$ at temperature T. We are then interested in obtaining the resulting change in silicon cavity length, $L_{Si}$, with temperature that this effect can provide. Substituting variables from the previous equations, taking the derivative with respect to temperature and neglecting higher order terms, we can obtain the following relation:

$$\frac{dL_{Si}}{dT} \approx -\left(\frac{\pi c}{\omega_m n_{Si}^2(T_0)}\right)\frac{\frac{dn_{Si}}{dT}}{\frac{d\Lambda}{dz}}$$

Utilizing the previous design criteria for the passive thermo-optic phase compensation criteria to enable thermally-insensitive laser operation, the required grating chirp parameter can then be approximated as:

$$\frac{d\Lambda}{dz} \approx \frac{\left(\frac{\pi c}{\omega_m n_{Si}(T_0)}\right)\frac{dn_{Si}}{dT}}{L_{Si}\frac{dn_{Si}}{dT} + L_{III-V}\frac{dn_{III-V}}{dT}}$$

This approximate chirp parameter is derived and provided to provide a concrete design example but is not the rigorous criteria for the disclosed laser cavities. Both the coupling and effective index temperature dependences must be considered to choose the correct chirp parameter. Generally, the required chirp parameter results in a "red-chirped" grating such that $d\Lambda/dz$ is a positive value. It should be noted that this criteria is opposite to traditional external cavity chirped grating designs that choose a negative $d\Lambda/dz$ to improve noise characteristics. The disadvantage of a positive $d\Lambda/dz$ chirp design in this configuration is mitigated by the large longitudinal laser cavity mode free spectral ranges enabled by the compact integrated cavity design.

The laser beam (output) of the laser system on the silicon chip 100 is monitored by a power monitor 18. The power monitor 18 is coupled to the waveguide 20. Power monitoring in the laser system on silicon chip 100 is utilized for control of the intra-cavity phase, to maintain efficient single-mode operation, for error-free link operation, and for using the laser across the operating temperature (e.g., 0-85° C.). The power monitor 18 can be intra-cavity (i.e., in the laser cavity 24) and/or after the output coupler band-reflect grating optical filter 140. In one case, having the power monitor 18 after the output coupler band-reflect grating optical filter 140 but prior to any other integrated system components is the better implementation (but is not a necessity). The power monitor 18 can be a normal detector that is butt coupled to a small tap, e.g., 1% directional coupler, from the output waveguide 20, and/or an inline power detector such as a lateral silicon PIN diode that collects photogenerated carriers from defect state absorption.

FIG. 2 illustrates the single frequency cavity diagram of the laser on the silicon chip 100 according to another embodiment. The single frequency cavity diagram of the laser on the silicon chip 100 in FIG. 2 is identical to FIG. 1 except that the passive intra-cavity optical phase compensation characteristic of the band-reflect grating with passive phase compensation 140 is omitted such that the laser output coupler grating is defined by a standard band-reflect grating 150 with all other reflectance characteristics shared with element 140.

As noted above in FIG. 1, the silicon chip 100 in FIG. 2 includes the intra-cavity transmission-mode optical band-pass filter 120 with a full-width half-maximum (FWHM) equal to or less than double the free-spectral range of the cavity Fabry-Perot (F-P) resonances, the active intra-cavity transmission-mode thermo-optic optical phase tuner element 130, the output coupler band-reflect grating optical filter 140 with an in-band reflectance in the range between 10% and 50% and a full-width half-maximum (FWHM) bandwidth equal to or greater than double the free-spectral range of the band-pass optical filter 120. The laser beam (output) of the laser system on the silicon chip 100 is monitored by a power monitor 18. Since the passive intra-cavity optical phase compensation characteristic of the band-reflect grating with passive phase compensation 140 is omitted in FIG. 2, the silicon chip 100 in FIG. 2 has to place all of its reliance to maintain the same phase φ in the active intra-cavity transmission-mode thermo-optic optical phase tuner element 130, which means that more power is required to maintain the phase of the laser beam.

A transmission function is the product of the intra-cavity transmission-mode optical band-pass filter 120 and Fabry-Perot (F-P) cavity. The transmission function is formally the amplitude and phase characteristic for various optical frequencies of a single output mode given a unity amplitude and phase input mode. Alternatively, the transmission function can be defined as the Fourier transform of the transient impulse response of the optical system for the various input and output modes of interest.

For single-mode operation with good side-mode suppression ratio, FWHM of the intra-cavity transmission-mode optical band-pass filter 120 should be less than the Fabry-Perot (F-P) free spectral range (FSR). A lower ratio (between the intra-cavity transmission-mode optical band-pass filter 120 and Fabry-Perot free spectral range (FSR)) is better. The free spectral range (FSR) is the spacing in optical frequency or wavelength between two successive reflected or transmitted optical intensity maxima or minima of an interferometer or diffractive optical element.

In traditional tunable lasers, the cavity length is adjusted while moving the intra-cavity filter wavelength (such as by turning a diffraction grating) to match the F-P and filter mode. Failure to synchronously adjust the two (the cavity length and the intra-cavity filter wavelength) results in mode-hopping or multi-mode operation.

As noted herein, temperature changes cause the wavelength/phase of the laser beam to change. In accordance with embodiments, temperature insensitive laser operation is provided by cavity design and/or active control. The intra-cavity transmission-mode optical band-pass filter 120 wavelength is held constant throughout operation (outside of laser startup initialization) through active control (active intra-cavity transmission-mode thermo-optic optical phase tuner element 130) and/or athermal design (the passive intra-cavity optical phase compensation characteristic of the band-reflect grating with passive phase compensation 140). The peak transmission angular frequency of the intra-cavity filter, $\omega_f$, is then considered to be constant throughout operation and independent of ambient temperature. The lasing mode of the Fabry-Perot cavity (i.e., laser cavity 24) is locked to the intra-cavity transmission-mode optical band-pass filter 120 through active control of the intra-cavity phase within the compensated round-trip phase range across temperature by maximizing output power as measured by intra-cavity or extra-cavity optical power monitor 18. This can be understood by considering the transmission ratio, TR, between the optical band-pass filter transmissions of intra-cavity filter at the resonance angular frequency, $T_{filter}(\omega_f)$, and at the angular frequency of the operating laser mode, $T_{filter}(\omega_m)$:

$$TR = \frac{T_{filter}(\omega_f)}{T_{filter}(\omega_m)}$$

Since any value of TR greater than 1 results in a reduction in the laser output power relative to the case where $\omega_m=\omega_f$, which is the desired operating condition for a stabilized laser operating frequency that is temperature independent. Ensuring a less than 1:1 ratio of the filter FWHM (in the intra-cavity transmission-mode optical band-pass filter) to Fabry-Perot mode spacing (FSR) guarantees a strong output power dependent error-signal for robust control of intra-cavity phase. This condition also ensures that the TR of $\omega_m$ is always less than the TR for $\omega_{m-1}$ or $\omega_{m+1}$ for TR<2, ensuring that the feedback loop has a sufficiently large error signal to continuously control operation in a single longitudinal mode of the laser cavity over the operating temperature range. Based on monitoring the power monitor 18, the active intra-cavity transmission-mode thermo-optic optical phase tuner element 130 adjusts the phase of the light in the laser cavity 24 and therefore controls $\omega_m$ as described by equation 53. The lasing wavelength can then be maintained throughout the temperature range of operation without undergoing changes of the Fabry-Perot mode order (i.e., without mode hops) to maintain error-free link operation.

Note that sub-headings are provided below for ease of understanding and not limitation.

Passive Thermo-Optic Phase Compensation

Figure 3A:
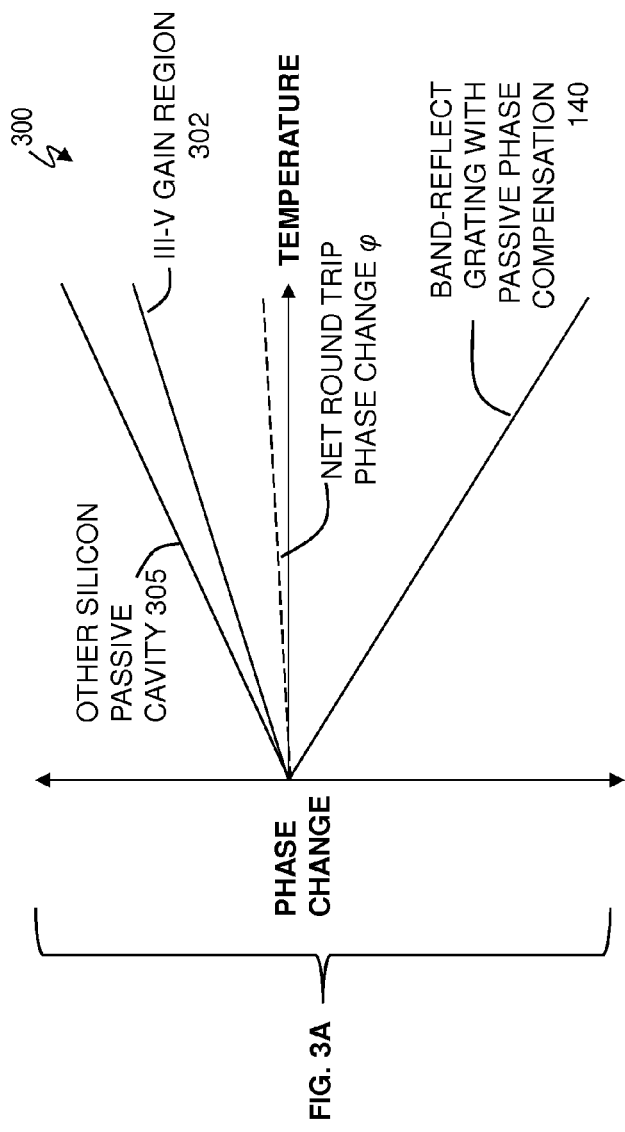
FIG. 3A illustrates a graph showing how the phase changes and passive phase compensation temperature changes correspondingly, according to an embodiment.

FIG. 3A illustrates a graph 300 showing how the III-V gain region (of the III-V chip 10) changes the phase of the laser beam with a change in operating temperature. As a result of an increase in temperature on the substrate 30, there is an increase in phase (i.e., phase change) in III-V gain region waveform 302 and an increase in phase (i.e., phase change in a state-of-the-art silicon passive cavity result in a waveform 305. Both waveforms 302 and 305 show an increase in phase with an increase in temperature of the silicon chip 100. However, the passive phase compensation waveform 310 of the passive intra-cavity optical phase compensation characteristic of the band-reflect grating with passive phase compensation 140 is passively configured to compensate for the phase change by the III-V gain region (of the III-V chip 10) and compensates for the resulting typical silicon passive cavity 305 phase change. A state-of-the-art system would require active phase control (i.e., outside power) to compensate for the increase in phase shown in FIG. 3A but FIG. 1 does not (necessarily) require active phase control although active intra-cavity transmission-mode thermo-optic optical phase tuner element 130 can be (optionally) utilized. Even when active intra-cavity transmission-mode thermo-optic optical phase tuner element 130 is utilized in the silicon chip 100 in FIG. 1, less power is required by the active intra-cavity transmission-mode thermo-optic optical phase tuner element 130 because the passive intra-cavity optical phase compensation characteristic of the band-reflect grating with passive phase compensation 140 compensates for the phase change.

Figure 3B:
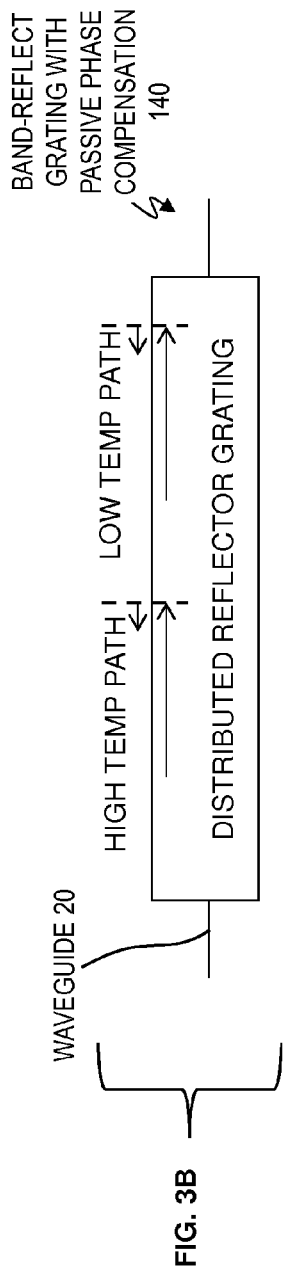
FIG. 3B illustrates a schematic of the passive intra-cavity transmission-mode optical phase compensation element with details according to and embodiment.

FIG. 3B illustrates a schematic of the passive intra-cavity optical phase compensation characteristic of the band-reflect grating with passive phase compensation 140 with details of the passive thermo-optic phase compensation according to embodiments. In one case, the passive intra-cavity optical phase compensation characteristic of the band-reflect grating with passive phase compensation 140 may be a distributed reflector grating that has smaller pitch on the left side to compensate for the increase in phase (of the light) corresponding to the increase in temperature of the silicon chip 100. The left side of the band-reflect grating with passive phase compensation 140 is closer to the III-V chip 10 and pointed to the III-V chip 10, while the right side is further away from the III-V chip 10. The pitch (linearly and/or gradually) increases from left to right (smaller pitch to wider pitch), such that the wider pitch on the right side compensates for the decrease in phase corresponding to the decrease in temperature (of the silicon chip 100). Accordingly, as the temperature increases and/or decreases (within the operation temperature (e.g., 0-85° C.) on the substrate 30 of the silicon chip 100, there is a corresponding pitch variation (from small pitch through wide pitch) to match the change in phase/wavelength in the passive intra-cavity optical phase compensation characteristic of the band-reflect grating with passive phase compensation 140. The smaller pitch on the left side reflects the light with the high temperature (higher phase and smaller wavelength), while the wider pitch on the right side reflects the light with the lower temperature (lower phase and longer wavelength).

Intra-Cavity Filters

FIG. 4 illustrates an example intra-cavity transmission-mode optical band-pass filter 120 according to an embodiment. In one implementation, the intra-cavity transmission-mode optical band-pass filter 120 may be any configuration of a ring-resonator, such as a Mach-Zehnder and/or grating transmission-mode filter with appropriate free-spectral range (FSR) and bandwidth suitable for laser cavity construction. In this implementation, FIG. 4 shows the ring-resonator with connected waveguide 20 for input and output of the light. The ring-resonator has a heater (e.g., a resistor or resistive element) that receives power in order to control the temperature of the ring-resonator. The filter resonance frequency of the ring-resonator is to be maintained throughout laser operation. In the example intra-cavity transmission-mode optical band-pass filter 120, FIG. 4 shows a front-up approach which is a first-order ring resonator filter that is thermally controlled (thus controlling the ring resonance frequency) to a constant temperature above the maximum designed operation ambient temperature of the laser system in the silicon chip 100.

A ring-resonator, also referred to as an optical ring resonator, is a set of waveguides in which at least one is a closed loop coupled to some sort of light input and output. These can be, but are not limited to being, waveguides. The concepts behind optical ring resonators use light and obey the properties behind constructive interference and total internal reflection. When light of the resonant wavelength/frequency is passed through the loop from input waveguide, the light builds up in intensity over multiple round-trips due to constructive interference and is output to the output bus waveguide which serves as a detector waveguide. Because only a select few wavelengths will be at resonance within the loop, the optical ring resonator functions as a filter. Additionally, two or more ring waveguides can be coupled to each other to form an add/drop optical filter.

Active Round-Trip Phase Control

Figure 5A:
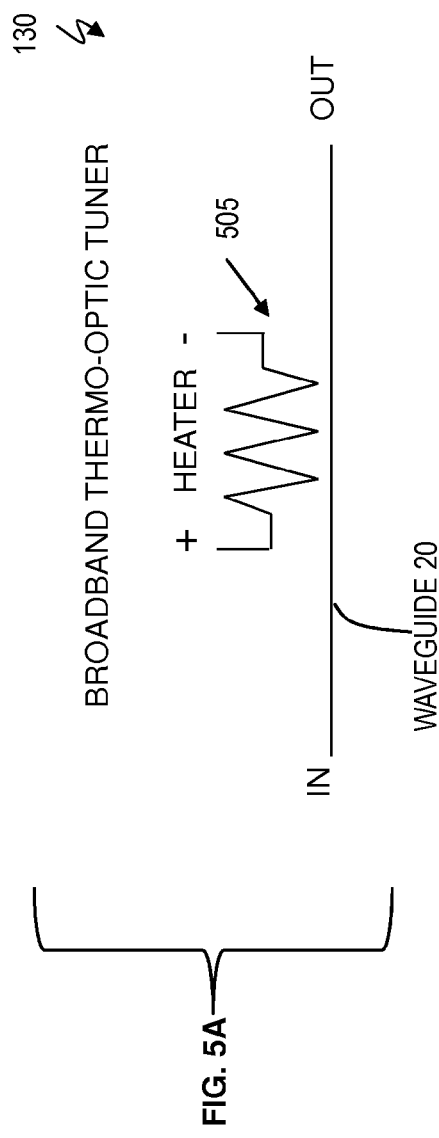
FIG. 5A illustrates an implementation of an active intra-cavity transmission-mode thermo-optic optical phase tuner element as a broadband thermo-optic tuner according to an embodiment.
Figure 5B:
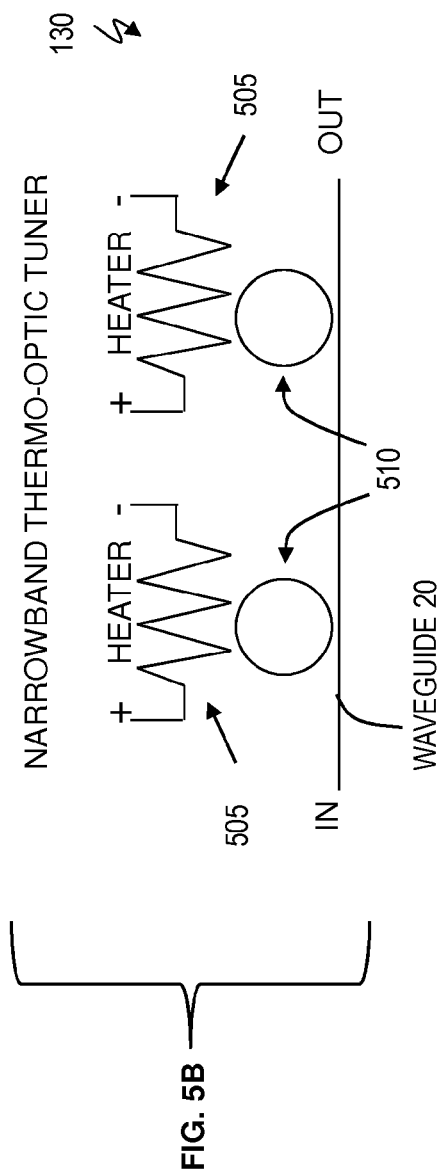
FIG. 5B illustrates another implementation of the active intra-cavity transmission-mode thermo-optic optical phase tuner element as narrowband thermo-optic tuners according to an embodiment.

FIGS. 5A and 5B show two different examples of the active intra-cavity transmission-mode thermo-optic optical phase tuner element 130 according to an embodiment. Although examples are provided, any method of phase control is suitable if the total range is approximately (~) $4\pi$.

FIG. 5A illustrates an implementation (which may be preferred but is not a necessity) of the active intra-cavity transmission-mode thermo-optic optical phase tuner element 130 as a broadband thermo-optic tuner because the zero amplitude response and ease of control of broadband thermo-optic tuner. The broadband thermo-optic tuner has a waveguide 20 in which the light travels in and out, and a heater 505. Current can be applied to the heater 505 to actively control the round-trip phase.

FIG. 5B illustrates another implementation of the active intra-cavity transmission-mode thermo-optic optical phase tuner element 130 as narrowband thermo-optic tuners (ring-resonator all-pass filters). The narrowband thermo-optic tuners are suitable as well, but add complexity for resonance frequency control. The narrowband thermo-optic tuners show a waveguide 20 with two ring-resonators 510, and each ring-resonator has a heater 505 to control the bandwidth.

Note also that carrier-injection tuners can be utilized either in the silicon cavity and/or in the III-V die, but the carrier-injection tuner adds complexity of amplitude fluctuations.

Reflectors

Figure 6:
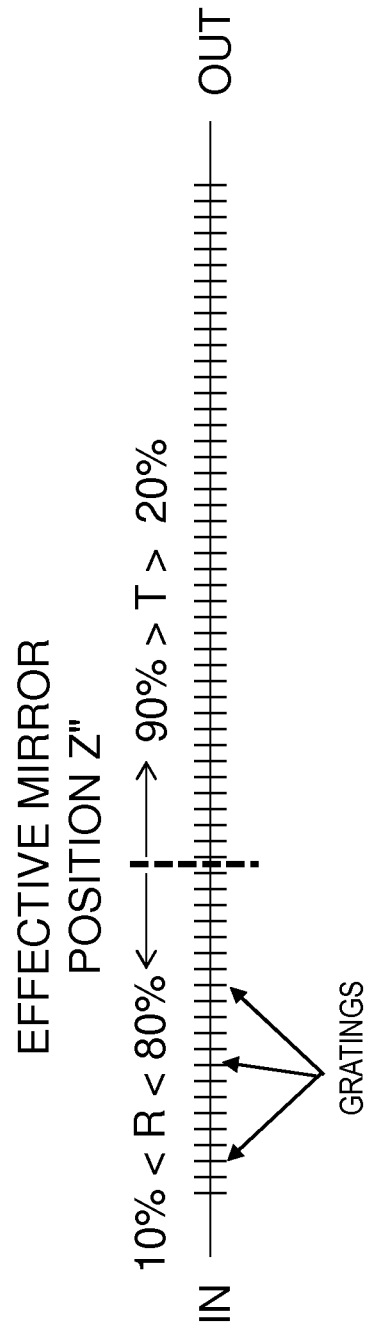
FIG. 6 illustrates an example output coupler band-reflect grating optical filter according to an embodiment.

FIG. 6 illustrates an example output coupler band-reflect grating optical filter 140 according to an embodiment. In one implementation, the output coupler band-reflect grating optical filter 140 may be a standard sidewall grating (partially etched or fully etched), which is a suitable output coupler for basic laser operation with in-band reflectance between 10% and 50%. The in-band reflectance of the sidewall grating is determined by III-V current-gain characteristic (of the III-V chip 10), passive cavity loss, coupling efficiency, and output power.

The bandwidth of the sidewall grating can be designed to have at least a 1 decibel (dB) suppressed reflectance for non-lasing filter order peaks (e.g., the peaks may be greater than (>) 3 dB in one case) in configurations without a compound intra-cavity filter characteristic that otherwise suppresses alternate filter order transmittance. Using the sidewall grating, compensation of the round-trip cavity phase with reduction in effective cavity length as a function of increasing temperature is included.

Mode Converter

Figure 7:
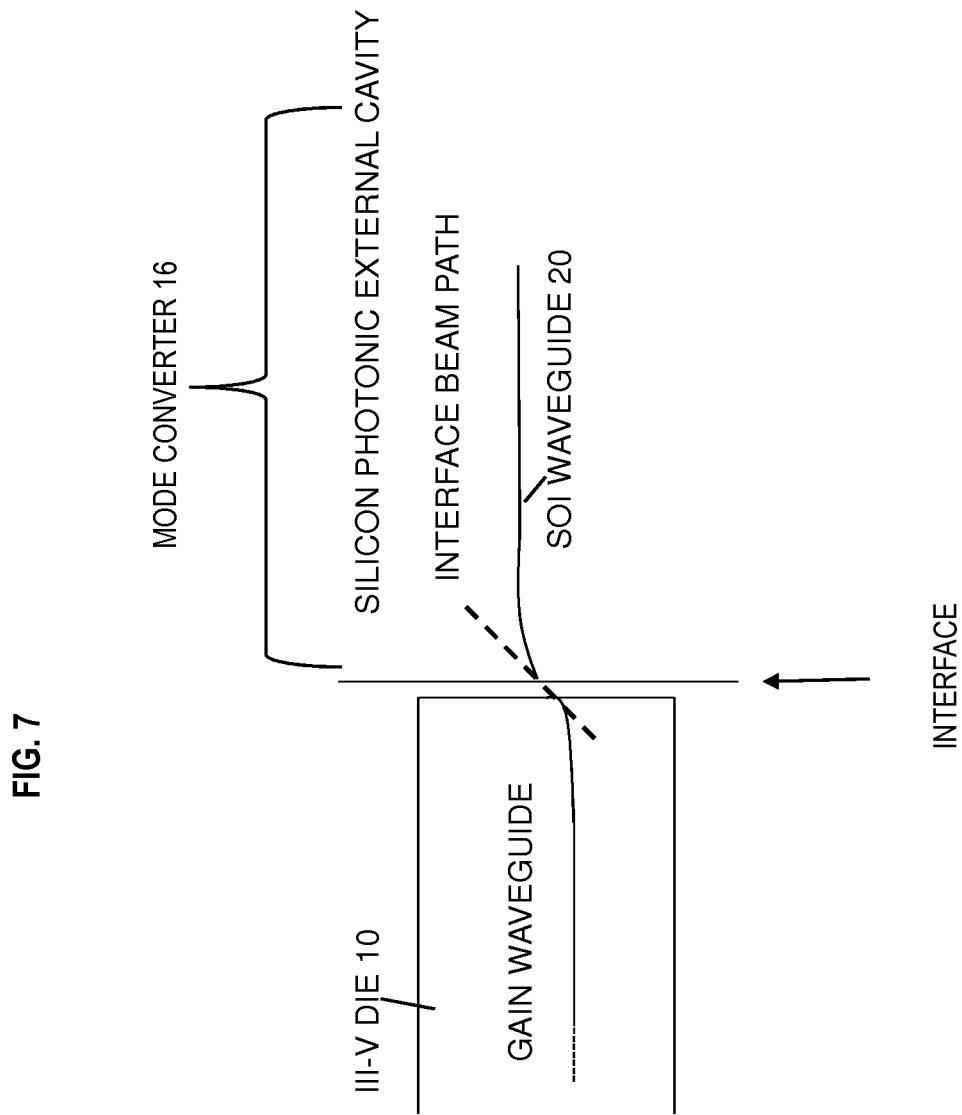
FIG. 7 illustrates an example of a mode converter according to an embodiment.

FIG. 7 illustrates an example of the mode converter 16 according to embodiment. Any standard laser to silicon-on-insulator (SOI) waveguide mode coupler and packaging strategy can be applied. Requirements of efficiency and reflectance are tied together in a requirement for stable single-mode operation. Ideal reflectance of $1e^{-5}$ (achievable through angled facet interface) may be relaxed to as high as 1% in highly efficient coupling schemes that allow the III-V die 10 HR back coating facet 12 and the output coupler band-reflect grating optical filter 140 (e.g., output coupler grating) to dominate the cavity Fabry-Perot characteristic.

Power Monitors

Figure 8:
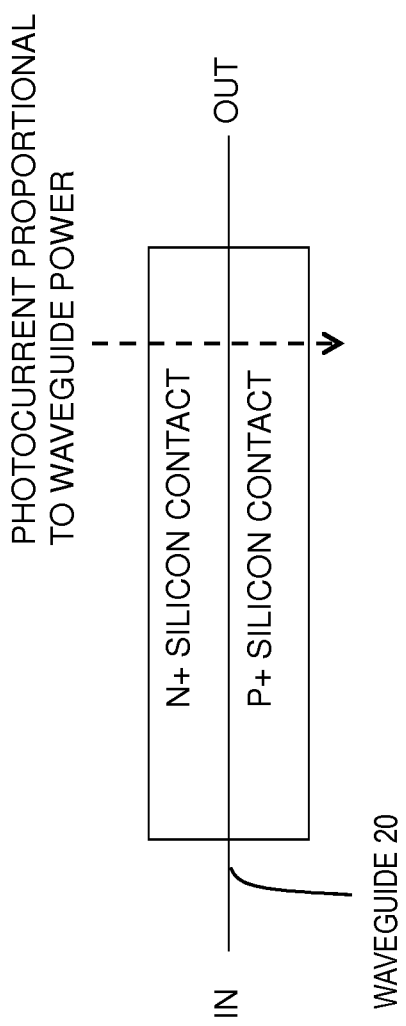
FIG. 8 illustrates an example implementation of a power monitor according to an embodiment.

FIG. 8 illustrates an example implementation of the power monitor according to an embodiment. The power monitor 18 may have an N+ doped silicon contact connected to a P+ doped silicon contact. The waveguide 20 connects laterally through the power monitor 18. Photocurrent proportional to the waveguide power (i.e., light beam) is generated in the power monitor 18, and the photocurrent flow perpendicular to the waveguide 20.

Power monitoring by the power monitor 18 in the laser system is important for control of the intra-cavity phase to maintain efficient single-mode operation for error-free link operation using the proposed laser across operating temperatures.

The power monitor 18 can be intra-cavity and/or after the output coupler band-reflect grating optical filter 140 (i.e., output coupler grating). Positioning the power monitor 18 after the output coupler band-reflect grating optical filter 140 but prior to any other integrated system components may be the better implementation (but is not a necessity).

The power monitor 18 can be a normal detector that is butt coupled to a small tap, e.g., 1% directional coupler, from the output waveguide 20, and/or an inline power detector such as a lateral silicon PIN diode that collects photogenerated carriers from defect state absorption.

Figure 9:
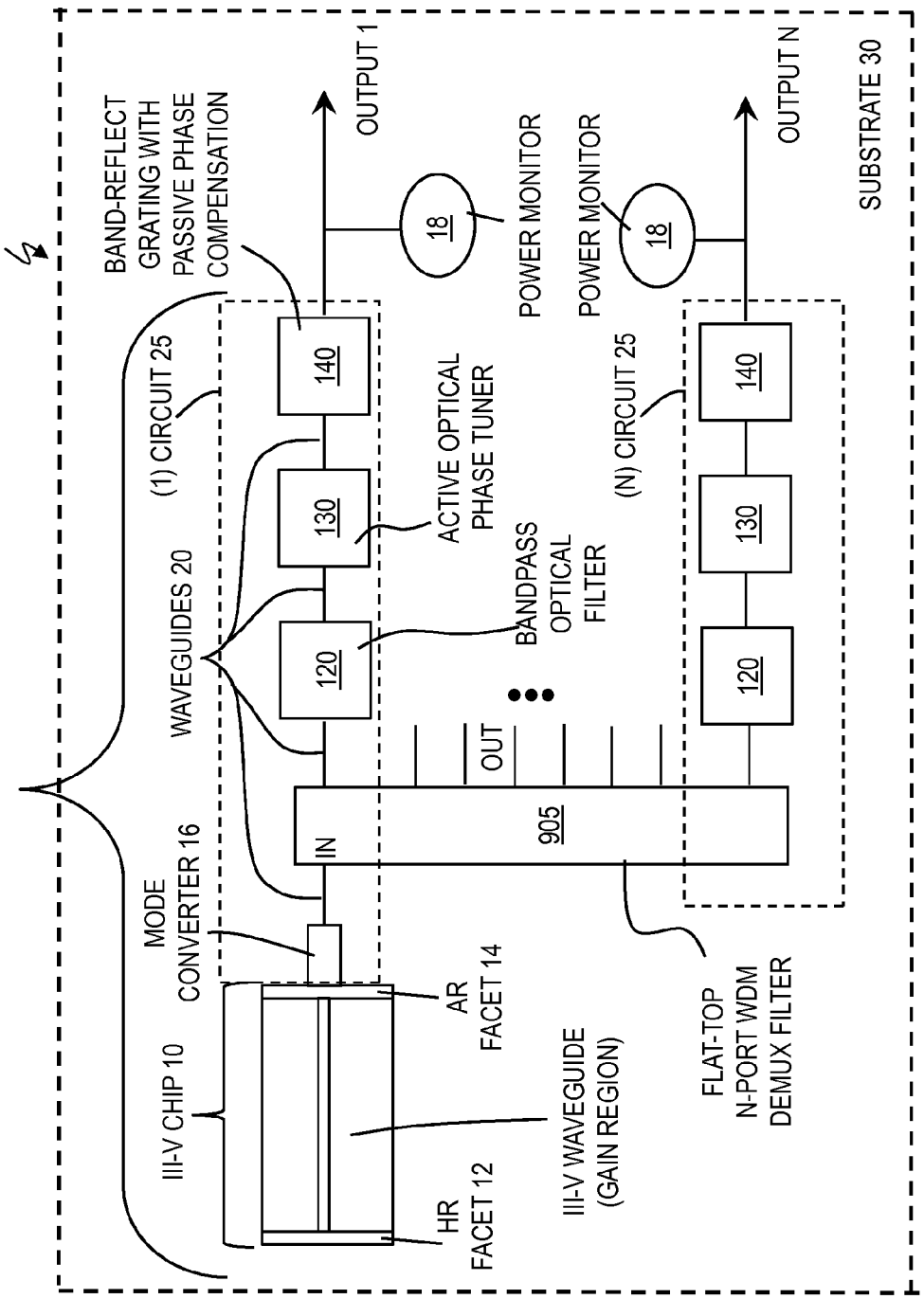
FIG. 9 illustrates a multi-frequency diagram of a laser on the silicon chip according to an embodiment.
Figure 10:
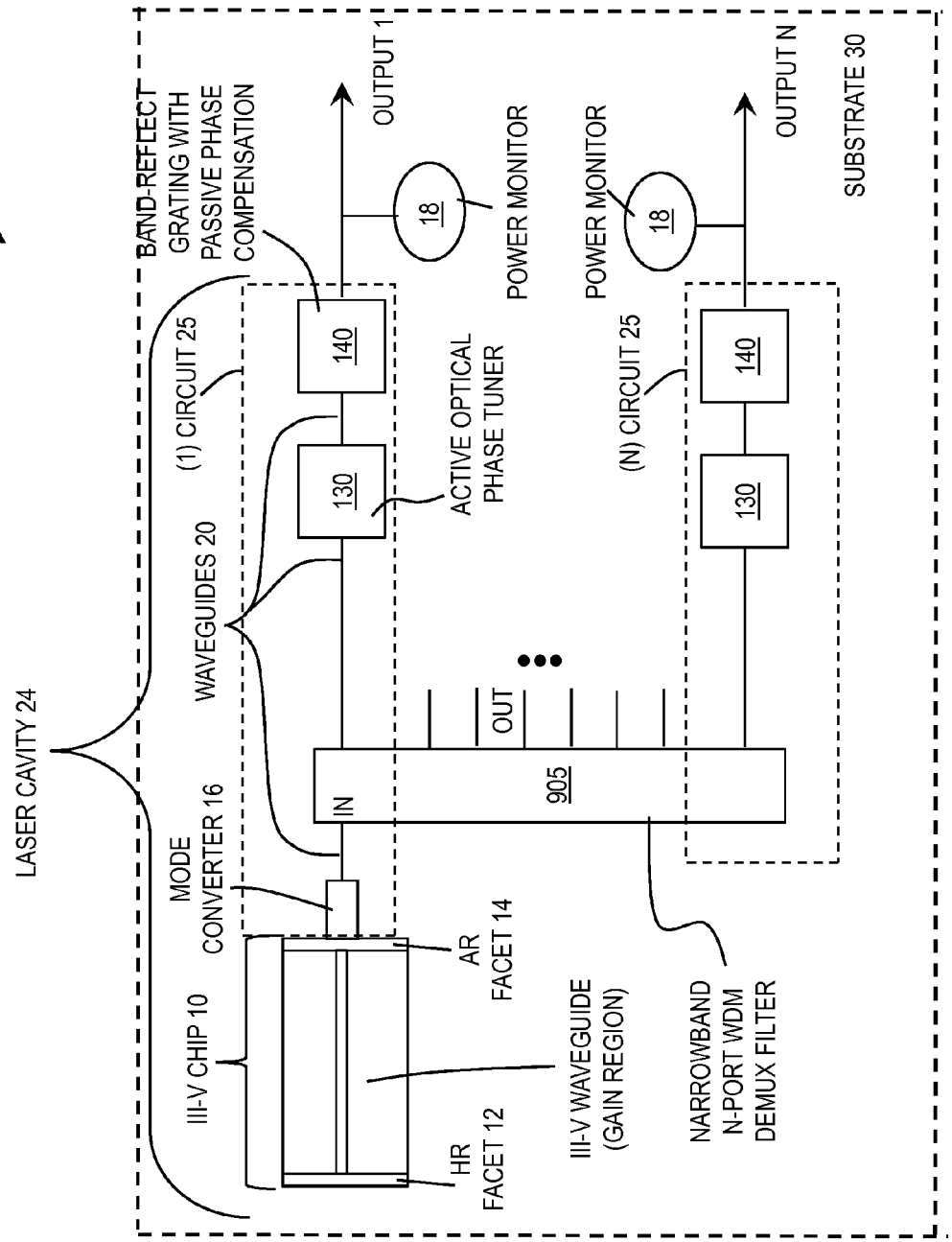
FIG. 10 illustrates another multi-frequency diagram of a laser on the silicon chip according to an embodiment.

Now, moving away from the sub-headings, multi-wavelength operation is discussed in FIGS. 9 and 10. Multi-wavelength operation may employ N-port demultiplexer filters, such as Mach-Zehnder interferometer (MZI) CWDM filters developed by MZI for transceiver applications.

FIG. 9 illustrates a multi-frequency diagram of a laser on the silicon chip 100 according to an embodiment. In FIG. 9, the silicon chip 100 now includes a coarse N-port wavelength division multiplexing (WDM) demultiplexing filter 905 positioned (directly) after the mode converter 16. The input port (IN) of the coarse N-port WDM demultiplexing filter 905 connects to the mode converter 16 to receive the light, and the output ports (OUT) of the coarse N-port WDM demultiplexing filter 905 connect to their respective 1-N integrated photonic circuits 25. As can be seen there are multiple output port. For example, the coarse N-port WDM demultiplexing filter 905 may receive light at different wavelengths at the input side from the mode converter 16, such that the coarse N-port WDM demultiplexing filter 905 demultiplexes (separates) the light by wavelength and outputs light of each wavelength to an individual output port. The output ports are connected to the circuits 25, and the 1-N circuits 25 each include the intra-cavity transmission-mode optical band-pass filter 120, the active intra-cavity transmission-mode thermo-optic optical phase tuner element 130, and the band-reflect grating with passive phase compensation element 140. In this case, silicon chip 100 is configured to output multiple light beams with each at a different wavelength.

Turning to FIG. 10, another multi-frequency diagram of a laser on the silicon chip 100 according to an embodiment. FIG. 10 is similar to FIG. 9 except that the intra-cavity transmission-mode optical band-pass filter 120 is omitted because the coarse N-port WDM demultiplexing filter 905 is sufficiently narrowband to eliminate the need for a separate optical band-pass filter 120. In FIG. 10, the coarse N-port WDM demultiplexing filter 905 is now a narrowband N-port WDM demultiplexing filter that meets all the previously described parameters of the intra-cavity transmission-mode optical band-pass filter 120. FIG. 10 is a multi-frequency diagram of the laser shown in FIG. 2, and the silicon chip 100 now includes the narrowband N-port wavelength division multiplexing (CWDM) demultiplexing filter 905 positioned (directly) after the mode converter 16. As noted above, the input port of the narrowband N-port WDM demultiplexing filter 905 connects to the mode converter 16 to receive the light, and the output ports of the coarse N-port WDM demultiplexing filter 905 connect to their respective 1-N circuits 25. For example, the narrowband N-port WDM demultiplexing filter 905 may receive light at different wavelengths at the input side from the mode converter 16, such that the narrowband N-port WDM demultiplexing filter 905 demultiplexes (separates) the light by wavelength and outputs light of each wavelength to an individual output port. The output ports are connected to the circuits 25, and the 1-N circuits 25 each include the active intra-cavity transmission-mode thermo-optic optical phase tuner element 130 and the output coupler band-reflect grating optical filter 140. In this case, silicon chip 100 is configured to output multiple light beams with each at a different wavelength. Besides having the narrowband N-port WDM demultiplexing filter 905 included and removing the intra-cavity transmission-mode optical band-pass filter 120, the silicon chip 100 in FIG. 10 operates as discussed in FIG. 1.

FIG. 11 illustrates a method 1100 of configuring the semiconductor chip 100 according to an embodiment. Reference can be made to FIGS. 1, 2, 9, and 10. At block 1105, the optical gain chip 10 is attached to a semiconductor substrate 30.

At block 1110, the integrated photonic circuit 25 is provided on the semiconductor substrate 30, and the optical gain chip 10 optically coupled to the integrated photonic circuit 25 forms the laser cavity 24.

At block 1115, the integrated photonic circuit 25 comprises the output coupler band-reflect optical grating filter with passive phase compensation 140, the active intra-cavity thermo-optic optical phase tuner element 130, and the intra-cavity optical band-pass filter 120.

At block 1120, the output coupler band-reflect optical grating filter with passive phase compensation 140, the active intra-cavity thermo-optic optical phase tuner element 130, and the intra-cavity optical band-pass filter 120 are optically coupled together.

The mode converter 16 is coupled between the optical gain chip 10 and the integrated photonic circuit 25. The output coupler band-reflect optical grating filter with passive phase compensation 140 is configured to reduce a net round trip phase change to within $4\pi$ over a temperature range. The temperature range is 0-85° Celsius.

The output coupler band-reflect optical grating filter with passive phase compensation 140 comprises a distributed reflector grating element (e.g., as shown in FIG. 3). The distributed reflector grating element has a smaller pitch at a first end and a wider pitch at the second end. The distributed reflector grating element is configured to shorten an effective cavity (length) of the laser cavity 24 with increasing temperature through increased index contract. The distributed reflector grating element has an elongated direction (e.g., length) and a width direction. The distributed reflector grating element changes in pitch along the elongated direction (e.g., length) such that the distributed reflector grating element varies from the smaller pitch at the first end and increases to the wider pitch at the second end.

When the N-port demultiplexing filter 905 is included the silicon chip 100, the silicon chip 100 includes output coupler band-reflect optical grating filter with passive phase compensation 140 (as shown in FIGS. 9 and 10). Although FIGS. 9 and 10 show different implementations. The N-port demultiplexing filter 905 is configured to provide different wavelengths of light to individual ones of the plurality of (1-N) integrated photonic circuits 25. In FIGS. 9 and 10, the mode converter 16 is coupled between the optical gain chip 10 and the coarse N-port WDM demultiplexing filter 905.

It will be noted that various semiconductor device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A semiconductor chip, comprising:
   an optical gain chip attached to a semiconductor substrate; and
   an integrated photonic circuit on the semiconductor substrate, the optical gain chip optically coupled to the integrated photonic circuit thereby forming a laser cavity, wherein the integrated photonic circuit comprises:
   an active intra-cavity thermo-optic optical phase tuner element;
   an intra-cavity optical band-pass filter; and
   an output coupler band-reflect optical grating filter with passive phase compensation;
   wherein the active intra-cavity thermo-optic optical phase tuner element, the intra-cavity optical band-pass filter, and the output coupler band-reflect optical grating filter with passive phase compensation are optically coupled together.

2. The semiconductor chip of claim 1, further comprising a mode converter coupled between the optical gain chip and the integrated photonic circuit.

3. The semiconductor chip of claim 1, wherein the output coupler band-reflect optical grating filter with passive phase compensation is configured to reduce a net round trip phase change to within $4\pi$ over a temperature range.

4. The semiconductor chip of claim 3, wherein the temperature range is 0-85° Celsius.

5. The semiconductor chip of claim 1, wherein the output coupler band-reflect optical grating filter with passive phase compensation comprises a distributed reflector grating element.

6. The semiconductor chip of claim 5, wherein the distributed reflector grating element has a smaller pitch at a first end and a wider pitch at a second end;
   wherein the distributed reflector grating element is configured to shorten an effective cavity of the laser cavity with increasing temperature through increased index contract.

7. The semiconductor chip of claim 6, wherein the distributed reflector grating element has an elongated direction and a width direction;
   wherein the distributed reflector grating element changes in pitch along the elongated direction such that the distributed reflector grating element varies from the smaller pitch at the first end and increases to the wider pitch at the second end.

8. A semiconductor chip, comprising:
   an optical gain chip attached to a semiconductor substrate;
   an N-port demultiplexing filter; and
   a plurality of integrated photonic circuits on the semiconductor substrate, the optical gain chip optically coupled to the plurality of integrated photonic circuits thereby forming a laser cavity, wherein the plurality of integrated photonic circuits each comprise:
   an output coupler band-reflect optical grating filter with passive phase compensation;
   an active intra-cavity thermo-optic optical phase tuner element; and
   an intra-cavity optical band-pass filter;
   wherein the output coupler band-reflect optical grating filter with passive phase compensation, the active intra-cavity thermo-optic optical phase tuner element, the intra-cavity optical band-pass filter are optically coupled together; and
   wherein the N-port demultiplexing filter is configured to provide different wavelengths of light to individual ones of the plurality of integrated photonic circuits.

9. The semiconductor chip of claim 8, further comprising a mode converter coupled between the optical gain chip and the N-port demultiplexing filter.

10. The semiconductor chip of claim 8, wherein the output coupler band-reflect optical grating filter with passive phase compensation is configured to reduce a net round trip phase change to within $4\pi$ over a temperature range.

11. The semiconductor chip of claim 10, wherein the temperature range is 0-85° Celsius.

12. The semiconductor chip of claim 8, wherein the output coupler band-reflect optical grating filter with passive phase compensation comprises a distributed reflector grating element.

13. The semiconductor chip of claim 12, wherein the distributed reflector grating element has a smaller pitch at a first end and a wider pitch at a second end;
   wherein the distributed reflector grating element is configured to shorten an effective cavity of the laser cavity with increasing temperature through increased index contract.

* * * * *